Sept. 23, 1958 O. K. NILSSEN 2,853,613

OSCILLATOR CIRCUIT

Filed Dec. 24, 1956

INVENTOR.
OLE K. NILSSEN
BY
Charles H. Brown
ATTORNEY 2,853,613
Patented Sept. 23, 1958

2,853,613

OSCILLATOR CIRCUIT

Ole K. Nilssen, Inkster, Mich., assignor to Radio Corporation of America, a corporation of Delaware Application December 24, 1956, Serial No. 630,208

11 Claims. (Cl. 250—36)

The invention relates to oscillator circuits designed to tune over a band of frequencies. Particularly, the invention relates to a frequency drift compensation circuit arrangement for use in local oscillator circuits as may be used in radio and television receivers, the degree or percentage of frequency drift compensation provided by the circuit arrangement being a function of oscillator frequency.

During the initial warm-up period of a local oscillator circuit, heat flows take place inside as well as outside the oscillator tube. The heat flows take place by radiation and conduction from the so called "hot bodies" such as the cathode and anode, and from all other heat producing elements included in the circuit. The flow of heat in various forms and directions unavoidably changes the tube constants (e. g. the interelectrode capacitances), circuit constants and, consequently, also the oscillator frequency. The rapid deviation or drift in the oscillator frequency during the initial warm-up period may be considered as the fast-acting portion of the frequency deviation curve plotted during the operating period of a local oscillator circuit.

As the local oscillator circuit continues to operate following the initial warm-up period, a gradual increase in the temperature of the tube components and associated circuit elements occurs. Various circuit elements, as, for example, the chassis upon which the oscillator circuit is mounted, undergo a slow rise in temperature. The resulting flow of heat causes a steady drift or deviation of the oscillator frequency with time during the period of operation, the frequency drift being considerably less rapid than that which occurs during the initial warm-up period. This steady deviation in the oscillator frequency occurring after the initial warm-up period and during the period of operation of the local oscillator circuit may be considered as the slow-acting portion of the frequency deviation curve. The invention is concerned with this slow-acting portion of the frequency deviation curve.

It has been found that, in the operation of a local oscillator circuit designed to tune over a band of frequencies, the degree of frequency drift of the oscillator circuit which occurs during the period of operation thereof (during the slow-acting portion of the frequency deviation curve) is not uniform at the different operating frequencies. The slope or degree of frequency drift tends in general to increase or in some applications decrease as the frequency of operation increases. Because of this action, the use of conventional compensating circuit arrangements, for example, the addition of a compensating capacitor in the circuit, has not proven entirely satisfactory. Assuming for the moment that the degree of frequency drift tends to increase as frequency increases, an effort to compensate for this deviation or frequency drift occuring when the oscillator circuit is tuned to a frequency at the upper end of the band of operating frequencies by means of conventional compensation circuits results in an over-compensation of the frequency drift occurring when the oscillator circuit is tuned to a frequency at the lower end of the band of operating frequencies. On the other hand, an effort to compensate for the deviation or frequency drift occurring when the oscillator circuit is tuned to a frequency at the lower end of the band by means of conventional compensating circuits results in an under-compensation of the frequency drift occurring when the oscillator circuit is tuned to a frequency at the upper end of the band.

In the use of television receivers, both black-and-white and color, as well as in the use of frequency modulation receivers, a definite requirement exists for the stability of each operating frequency of the local oscillator. For example, the local oscillator in a color television receiver should be held within about one hundred kilocycles of its correct frequency on each channel to prevent a noticeable degradation of the picture. For the reasons outlined above, it is very difficult, if not impossible, to obtain this required degree of frequency stability at each operating frequency of the tunable oscillator circuit used in such receivers by using compensation circuits previously known.

An object of the invention is to devise an improved frequency drift compensation circuit arrangement for oscillator circuits designed to tune over a band of frequencies.

Another object of the invention is to provide an improved frequency drift compensation circuit arrangement for oscillators, in which the degree of frequency drift compensation is a function of the oscillator frequency.

The objects of the invention are accomplished by the use of a tuned circuit including a compensating capacitor and an inductance coupled to the frequency-determining circuit of a tunable oscillator. The compensating capacitor is constructed and arranged in the circuit so as to oppose the frequency drift of the oscillator. The inductance tends electrically to change the effect of the compensating capacitor according to the operating frequency of the tunable oscillator. In other words, as the operating frequency to which the oscillator is tuned is changed in a given direction, the inductance functions to change the effect of the compensating capacitor in a desired manner. Assuming for the moment that, in a particular application, a greater degree of frequency drift occurs in general at the upper frequencies than at the lower frequencies of the frequency band over which a local oscillator is tunable. By using the circuit arrangement of the invention, a greater degree or percentage of frequency drift compensation can be provided at the upper frequencies than is provided at the lower frequencies where the greater degree of frequency drift compensation is not needed. Because the percentage of frequency drift compensation obtained by the circuit arrangement of the invention is a function of oscillator frequency, the problem of over-compensation and under-compensation referred to above is avoided.

A detailed description of the invention follows, taken in connection with the accompanying drawing, wherein.

Figure 1:
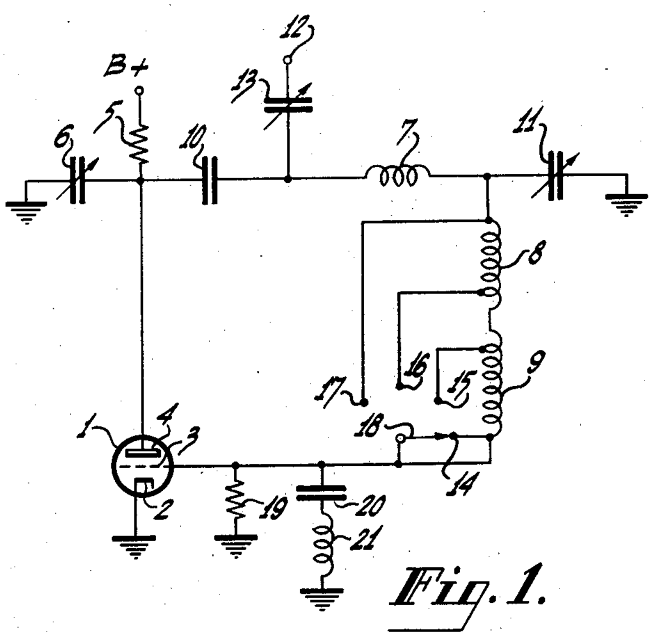
Figure 1 is a circuit diagram of an oscillator circuit using the invention.

Referring to Figure 1, there is shown a tunable oscillator circuit including an embodiment of the invention, the oscillator circuit being of a type that is widely used in television receivers. While a type of oscillator circuit referred to in the art as a Colpitts oscillator is shown for purposes of description, it will be apparent from the following description that the frequency drift compensation circuit arrangement of the invention may be used in other known oscillator circuits without departing from the spirit thereof. An electron discharge device or tube 1 includes a cathode 2, grid 3 and anode 4. The cathode 2 is connected to a point of fixed reference potential, hereinafter referred to as ground. The aode 4 is connected to the positive or B+ terminal of a source of unidirectional potential through a resistor 5. A variable (trimmer) capacitor 6 is connected between the anode 4 and ground. The anode 4 is further connected to one end of a series network including three inductors 7, 8 and 9 over an electrical path including a direct current blocking capacitor 10. A variable (fine tuning) capacitor 11 is connected from the junction of inductors 7 and 8 to ground. Oscillatory energy for injection into a utilization circuit such as a mixer stage is taken off by a connection from the junction of capacitor 10 and inductor 7 to an output terminal 12 including a variable (volume control) capacitor 13.

The inductors 8, 9 are provided with a number of taps 14, 15, 16 and 17 which may correspond, for example, to channels 2, 6, 7 and 13, respectively, of a television receiver. While only four taps are shown, it is to be understood that the number thereof can be varied to meet the requirements of a particular application. Tap 17 corresponds to the upper end of the frequency band and tap 14 corresponds to the lower end of the frequency band over which the oscillator is tunable. A wiper arm 18 is mounted so as to be selectively driven in and out of contact with the respective taps 14, 15, 16, 17 by manual or automatic means (not shown). The wiper arm 18 is connected to the grid 3 over an electrical circuit including a series resonant tuned circuit connected at one end to ground and a grid resistor 19. The series resonant tuned circuit includes a compensating capacitor 20, for example, a ceramic capacitor with a negative temperature coefficient, and an inductor 21 arranged according to the invention.

The construction and operation of an oscillator circuit of the type shown in Figure 1 is known in the art and need not be described in detail. The tank circuit of the oscillator includes the inductor 7, a portion of the inductors 8, 9 depending upon the setting of wiper arm 18, and the interelectrode capacitances of tube 1, namely, the grid 3—cathode 2 capacitance and the anode 4—cathode 2 capacitance. Any change in the interelectrode capacitances of tube 1, due, for example, to heat flows results in a drift or deviation of the oscillator frequency. The change or drift in the oscillator frequency is opposed by the compensating capacitor 20. That is, the capacitor 20 changes value in the opposite direction to the change in the value of the interelectrode capacitances. For example, if the interelectrode capacitances increase in value due to heat flows, resulting in a decrease of oscillator frequency, capacitor 20 decreases in value to oppose the change in oscillator frequency, and so on.

Figure 2:
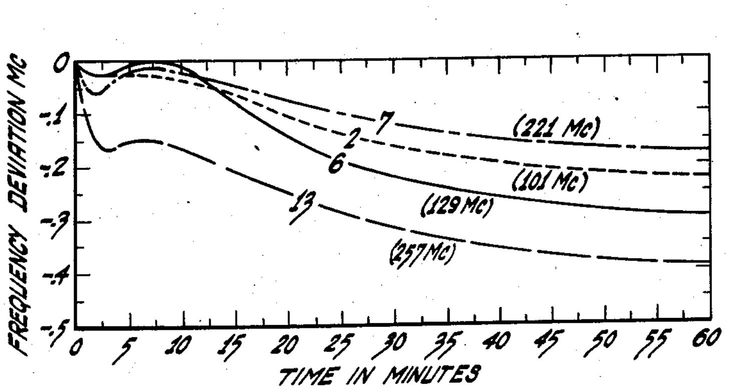
Figure 2 is a chart useful in explaining the invention.

The frequency drift characteristics of a typical television receiver local oscillator of the type shown in Figure 1 without the frequency drift compensation circuit arrangement of the invention are given by way of example in Figure 2. Four channels of operation 2, 6, 7 and 13 of different frequencies, as indicated, are shown. During the initial warm-up period of the oscillator, a different but in each case rapid frequency drift or deviation of the oscillator frequency occurs. This is the fast-acting portion of the frequency deviation curve referred to above. An intermediate portion follows the fast-acting portion during which the compensating capacitor 20 achieves some degree of frequency stability, halting the rapid frequency drift occurring during the initial warm-up period. Following the intermediate portion, the gradual increase of heat flows causes a steady though less rapid rise in the degree of frequency deviation of the oscillator frequencies. A comparison of the curves will indiacte that the rate and degree of frequency drift during the remaining or slow acting portion of the frequency deviation curves is not the same or, in other words, uniform for all the channels. In the example given in Figure 2, the difference in the degrees of frequency deviation between channels 2 and 6 is not too large and can be adequately compensated. The considerably greater difference in the degrees of frequency deviation between channels 7 and 13 is, however, of concern in the proper operation of the oscillator. In the latter case, the necessary compensation can be accomplished, if at all, only with considerable difficulty by using conventional circuits. It can be said generally in connection with the curves shown in Figure 2 that the degree or rate of frequency drift tends to increase as the operating frequency of the tunable oscillator is increased. More frequency drift compensation is needed at the upper end of the frequency band than is needed over the remaining portion of the frequency band.

According to the invention, as shown in Figure 1, an inductor 21 is inserted in series with the compensating capacitor 20 to form a series resonant tuned circuit which is always capacitive in nature. The values of the capacitor 20 and inductor 21 are set so that the tuned circuit resonates at a desired frequency above the upper oscillator frequency. The effect of the inductor 21 is to amplify or increase the effect of the compensating capacitor 20 to a maximum degree when the oscillator is tuned to the frequency of channel 13 and to a lesser degree as the oscillator is tuned over the frequency band to the operating frequency at the lower frequency end thereof. A maximum percentage of frequency drift compensation is provided at the upper end of the frequency band where it is needed. On the other hand, a lesser percentage of frequency drift compensation is provided at the lower end of the frequency band where the additional compensation could result in over-compensation.

The operation of the invention can be described by assigning values to the various components thereof. The values are given only by way of example and can be changed to meet the requirements of a particular application. It will be assumed that an oscillator circuit designed to tune over a frequency band is constructed to oscillate at a frequency of 160 megacycles at the upper end of the band. It will be further assumed that the oscillator is generally characterized by a greater degree of frequency drift at the upper end of the frequency band than at the lower end of the frequency band. A compensating capacitor, corresponding to capacitor 20 shown in Figure 1, is assigned a value of 10 micro-microfarads. The value of an inductor corresponding to the inductor 21 shown in Figure 1 is determined so that the series resonant tuned circuit including the capacitor and the inductor is set to resonate at a frequency greater than 160 megacycles. The actual frequency at which the tuned circuit is set to resonate is determined according to the percentage of frequency drift compensation required at the different operating frequencies. The closer the resonant frequency of the tuned circuit is to the operating frequency of the oscillator, the greater will be the percentage of frequency drift compensation obtained at that operating frequency. The resonant frequency of the tuned circuit can be determined by using an experimental and/or analytical approach understood in the art to obtain the required percentage of frequency drift compensation at the different operating frequencies. In the instant case, the resonant frequency of the tuned circuit will be set above 160 megacycles to obtain the proper percentage of frequency drift compensation at the upper end of the frequency band, a correspondingly lesser percentage of frequency drift compensation being obtained over the remaining portion of the frequency band. In one application, given by way of example, the compensating capacitor may be said to have a reactive impedance of minus (−) j 100 ohms and the inductor, for example a reactive impedance of positive (+) j 50 ohms. The net reactive impedance is minus (−) j 50 ohms. The tuned circuit remains capacitive in nature. Now assume that a one percent decrease in the reactive impedance of the capacitor occurs due to a decrease in oscillator frequency resulting from a change in temperature. The reactive impedance of the capacitor becomes minus (−) j 99 ohms, the reactive impedance of the inductor remaining the same. The net reactive impedance now becomes minus (−) j 49 ohms. Instead of a one percent frequency drift compensation by the capacitor of the tuned circuit, the change across the terminals of the tuned circuit is two percent. It is to be noted that a similar increase in the percentage of compensation would occur if the reactive impedance of the capacitor increased due to an increase in oscillator frequency.

If the operating frequency of the oscillator were halved, the reactive impedance of the capacitor would now be minus (−) j 200 ohms and that of the inductor a positive (+) j 25 ohms or a net of minus (−) j 175 ohms. A one percent decrease in the reactive impedance of the capacitor causes the reactive impedance thereof to become a minus (−) j 198 ohms. The net reactive impedance becomes minus (−) j 173 ohms, resulting in a percentage compensation of approximately one and two-tenths percent instead of the one percent resulting from the change in the value of the capacitor. The resulting percentage compensation would be the same if the reactive impedance of the capacitor were to instead increase the one percent. From a comparison of the percentages of frequency drift compensation, it is apparent that, as the oscillator frequency approaches the resonant frequency of the compensating circuit according to the invention, the same percentage change in the value of the capacitor 20 results in a greater percentage of frequency drift compensation. A larger degree of frequency drift compensation is provided for the frequencies at the upper end of the frequency band where it is needed than for the frequencies at the lower end of the band where the additional compensation is not needed.

Because of the operating characteristics of the compensation circuit of the invention as outlined above, the invention can be used to advantage, for example, in the local oscillator having the frequency drift characteristics shown in the curves of Figure 2. The resonant circuit including the capacitor 20 and inductor 21 would be set to resonate at a frequency above that of channel 13 (257 megacycles). The invention will function to reduce both the magnitude and degree of frequency deviation occurring in time at the different frequencies, a greater percentage of compensation being provided for channel 13 than for channel 7, and so on. In this connection, it should be noted that the invention will function to decrease the amount and speed of frequency deviation occurring during the initial warm-up period. As a result, the curves representing the frequency deviation occurring at the different operating frequencies will all more nearly approximate in appearance a curve representing zero frequency deviation. The curves will indicate a more nearly uniform degree of frequency deviation occurring at the different operating frequencies. In tests conducted on an oscillator circuit similar to that shown in Figure 1 using the compensating circuit of the invention, the oscillator being characterized by frequency drift curves approximating the curves at the different operating frequencies shown in Figure 2, the tuned circuit of the invention including a capacitor having a value of 10 micro-microfarads was set to resonate at a frequency of 450 megacycles. It was found that, following an initial adjustment period of two minutes, the maximum frequency deviation occurring at the different operating frequencies was approximately plus or minus 50 kilocycles.

It has been assumed in the discussion so far that it is necessary to provide a greater percentage frequency drift compensation for the frequencies at the upper end of the frequency band than is provided for the frequencies at the lower end thereof. In this case the tuned circuit is set to resonate at a frequency above the upper end of the frequency band. However, it may be found in certain applications that the degree of frequency drift increases in general as the operating frequency of a tunable oscillator decreases, requiring a greater percentage of frequency drift compensation at the lower end of the frequency band than is required at the upper end of the band. In this case, the tuned circuit is set to resonate at the desired frequency below the lower end of the frequency band. The operation of the invention will be similar to that described above, the proper percentage of frequency drift compensation being provided at the different operating frequencies. In addition, it is possible to set the compensating circuit of the invention to resonate at a frequency between the limits of the frequency band over which an oscillator is tunable. The particular operation and use of the invention will depend upon the requirements of the circuits or equipment in combination with which the invention is to be used.

In describing the invention, reference has been made to inductor 21. In actual practice, as in very high frequency circuits, inductor 21 may be a wire connection between the compensation capacitor 20 and ground. The length of wire is determined so as to cause the tuned circuit to resonate at the desired frequency. While a series resonant circuit is shown by way of example in Figure 1, it is possible to make use of the invention instead in the form of parallel circuits, following tuned resonant circuit theory understood in the art. The greater the complexity of the circuit, the more flexibility in operation is provided.

What is claimed is:

1. A frequency drift compensating circuit for use in an oscillator comprising, in combination, a compensating device coupled to the frequency-determining circuit of said oscillator and arranged to compensate for a drift in oscillator frequency, a reactive element coupled to said device so as to form a tuned resonant circuit including said device and said element, the percentage of frequency drift compensation obtained by said device being varied by the operation of said element as a function of the operating frequency of said oscillator.

2. In combination, an oscillator, a compensating capacitor coupled to the frequency-determining circuit of said oscillator and arranged to compensate for a drift in oscillator frequency, a reactive element coupled to and of opposite sign from that of said capacitor so as to form a tuned resonant circuit including said capacitor and said reactive element, the percentage of frequency drift compensation obtained by said capacitor being varied by the operation of said element as a function of the operating frequency of said oscillator.

3. A frequency drift compensating circuit for use in an oscillator, said oscillator being tunable over a band of frequencies, said circuit comprising, in combination, a compensating capacitor coupled to the frequency-determining circuit of said oscillator, the capacitance of said capacitor varying as a function of the oscillator frequency so as to compensate for a drift in the oscillator frequency, a reactive element coupled to said capacitor to form a tuned resonant circuit, the percentage of frequency drift compensation obtained by said capacitor being varied by the operation of said element as a function of the operating frequency of said oscillator.

4. A frequency drift compensating circuit as claimed in claim 3 and wherein said tuned circuit is tuned to a frequency outside said band of frequencies.

5. In combination, an oscillator, a frequency drift compensating capacitor coupled to the frequency-determining circuit of said oscillator and arranged to oppose a drift in oscillator frequency, an inductor coupled to said capacitor so as to form a tuned resonant circuit including said capacitor and said inductor, the percentage of frequency drift compensation obtained by said capacitor being varied by the operation of said inductor as a function of the operating frequency of said oscillator.

6. In combination, an oscillator, a compensating capacitor coupled on one side to the frequency-determining circuit of said oscillator, the capacitance of said capacitor varying as a function of the oscillator frequency so as to compensate for a drift in oscillator frequency, a lumped inductor coupled between the other side of said capacitor and a point of fixed reference potential to form a series resonant tuned circuit including said capacitor and said inductor, said tuned circuit being tuned to a frequency different from the operating frequency of the oscillator, the percentage of frequency drift compensation obtained by said capacitor being varied by the operation of said inductor as a function of the operating frequency of said oscillator.

7. A frequency drift compensating circuit for use in an oscillator tunable over a band of frequencies, said circuit comprising, in combination, a compensating capacitor coupled on one side to the frequency-determining circuit of said oscillator, the capacitance of said capacitor varying as a function of the oscillator frequency so as to compensate for a drift in the oscillator frequency, a lumped inductor coupled between the other side of said capacitor and a point of fixed reference potential to form a series resonant tuned circuit including said capacitor and said inductor, the percentage of frequency drift compensation obtained by said capacitor being varied by the operation of said inductor as a function of the operating frequency of said oscillator.

8. A frequency drift compensating circuit as defined in claim 7, wherein said tuned circuit is tuned to a frequency outside said band of frequencies.

9. A frequency drift compensating circuit as defined in claim 7 and wherein the values of said capacitor and said inductor are chosen to cause said tuned circuit to always be capacitive in nature.

10. A frequency drift compensating circuit for use in an oscillator tunable over a band of frequencies and characterized by a greater degree of frequency drift at one end of the frequency band than at the other end of the frequency band, said oscillator including a parallel tuned circuit of inductance and capacitance and having means for varying the value of said inductance, said frequency drift compensating circuit comprising a compensating capacitor coupled at one side to the frequency-determining circuit of said oscillator, the capacitance of said capacitor varying as a function of the oscillator frequency so as to compensate for a drift in the oscillator frequency, a lumped inductor coupled between the other side of said capacitor and a point of fixed reference potential to form a series resonant tuned circuit including said capacitor and said inductor, the values of said capacitor and said inductor being determined to cause said series resonant circuit to be always capacitive in nature and to resonate at a frequency which is outside the frequency band and determined according to the frequency at said one end of the frequency band of said oscillator, the percentage of frequency drift compensation obtained by said capacitor being varied by said inductor to cause a greater percentage of frequency drift compensation for the frequencies at said one end of the frequency band than for the frequencies at the other end of the frequency band.

11. A frequency drift compensating circuit for use in an oscillator tunable over a band of frequencies and characterized by a greater degree of frequency drift at the upper end of the frequency band than at the lower end of the frequency band, said oscillator comprising an electron discharge device having an anode, a control grid and a cathode connected to a point of fixed reference potential, means to connect said anode to a source of positive potential and to one side of a series network including a plurality of inductors, said network including means to vary the value of the inductance provided by said network, means to connect the other side of said network to said control grid, said compensating circuit comprising a capacitor coupled at one side to the junction of said network and said control grid, the capacitance of said capacitor varying as a function of the oscillator frequency so as to compensate for a drift in the oscillator frequency, a lumped inductor coupled between the other side of said capacitor and said point of fixed reference potential to form a series resonant tuned circuit including said capacitor and said lumped inductor, the values of said capacitor and said lumped inductor in said series resonant tuned circuit being determined to cause said series resonant tuned circuit to be always capacitive in nature and to resonate at a given frequency above the frequency at said upper end of the frequency band of said oscillator, whereby said given frequency is outside the frequency band, the percentage of frequency drift compensation obtained by said capacitor being varied by said lumped inductor to cause a greater percentage of frequency drift compensation for the frequencies at the upper end of the frequency band than for the frequencies at the lower end of the frequency band.

References Cited in the file of this patent

UNITED STATES PATENTS

| | | |
|---|---|---|
| 2,281,461 | Smith | Apr. 28, 1942 |
| 2,310,797 | Lea | Feb. 9, 1943 |